US005835350A

United States Patent [19]

Stevens

[11] Patent Number: 5,835,350

[45] Date of Patent: Nov. 10, 1998

[54] ENCAPSULATED, BOARD-MOUNTABLE POWER SUPPLY AND METHOD OF MANUFACTURE THEREFOR

[75] Inventor: David L. Stevens, Mesquite, Tex.

[73] Assignee: Lucent Technologies Inc., Murray Hill, N.J.

[21] Appl. No.: 772,681

[22] Filed: Dec. 23, 1996

[51] Int. Cl.[6] .......... H05K 7/20

[52] U.S. Cl. .......... 361/704; 361/705; 361/707; 361/712; 361/717; 361/718; 361/719; 361/736; 361/752; 257/712; 257/717; 257/787; 257/796; 165/80.2; 336/200; 363/141

[58] Field of Search .......... 361/704, 705, 361/707, 712, 717, 718, 719, 736, 752; 257/707–709, 712, 713; 165/80.3, 185, 1; 174/16.3, 52.2; 363/141; 336/200

[56] References Cited

U.S. PATENT DOCUMENTS

| | | | |
|---|---|---|---|
| 4,899,256 | 2/1990 | Sway-Tin | 361/715 |
| 5,075,821 | 12/1991 | McDonnal | 361/721 |
| 5,384,683 | 1/1995 | Tsunoda | 361/707 |
| 5,610,799 | 3/1997 | Kato | 361/752 |
| 5,642,276 | 6/1997 | Lotfi et al. | 363/144 |
| 5,659,462 | 8/1997 | Chen et al. | 363/21 |

OTHER PUBLICATIONS

Publication from ISHM '95 Proceedings entitled "A New Leadframeless IC Carrier Package Using Metal Base Substrate" pp. 348–352 Authors: Junsuke Tanaka, Kunihiro Nagamine, Toshiharu Koike, Seiichi Takahashi.

*Primary Examiner*—Leo P. Picard
*Assistant Examiner*—Boris L. Picard

[57] ABSTRACT

A power supply and a method of manufacture therefor. The power supply includes a circuit board containing conductors for interconnecting electrical components of the power supply and a thermally-conductive case having an integral electrically insulating layer. The thermally-conductive case forms a reservoir to receive the circuit board therein. The power supply further includes a power semiconductor device having a body connected in thermal communication with the thermally-conductive case and terminals coupled to the conductors of the circuit board. The power supply still further includes an encapsulant, located within the reservoir, capable of ensconcing the power semiconductor device and the electrical components. Additionally, electrical leads extend from the power supply that allow the power supply to be coupled to a printed wiring board.

18 Claims, 3 Drawing Sheets

200

275
215
220
210
236
230
233
265
245
260
255
270
240
250

ENCAPSULATED, BOARD-MOUNTABLE POWER SUPPLY AND METHOD OF MANUFACTURE THEREFOR

TECHNICAL FIELD OF THE INVENTION

The present invention is directed, in general, to power electronics and, more specifically, to an encapsulated, board-mountable power supply and a method of manufacture therefor.

BACKGROUND OF THE INVENTION

Electronic devices for the power supplies or other applications are conventionally provided in a protective, heat-dissipating package. Often, the device (e.g., a metal oxide semiconductor field-effect transistor, or "MOSFET") is attached to a lead-frame by a wire bonding technique. The device is then encapsulated or "molded," wherein an encapsulant is formed about the device to yield a unitary, board-mountable package device. One well-known configuration for board-mountable package is a so-called dual in-line package ("DIP"), wherein electrical leads protrude from opposing sidewalls of the package. The leads are advantageously so arranged to allow the package to be mounted to a circuit board by various conventional soldering processes. DIPs are widely used for packaging integrated circuits, most often in telecommunications or computer-related environments.

In a power electronics environment, the packaged power devices are conventionally mounted directly to a circuit board, using either through-hole or surface-mounting techniques. The devices are then joined with other electronic components to form a circuit, perhaps to function as a power supply such as a DC/DC power converter.

As with other types of electronic components, the trend in the design of power supplies has been toward achieving increased power and device density and lower device profile. However, any improvements in power, density and profile cannot be at the expense of the thermal and electrical characteristics of the components and overall power supply.

Analogous to the packaged power devices, the power supply is conventionally encapsulated to form a packaged power supply module. Using the DC/DC power converter as an example, a simplified process of constructing the packaged DC/DC power converter will hereinafter be described. First, the packaged devices (e.g., power switching devices) of the DC/DC power converter that must be thermally managed due to high power dissipation are mounted via an insulator to a five-sided metal enclosure. Next, a printed circuit board including the remaining components (e.g., a transformer, inductor, output filter and control circuitry) of the DC/DC power converter is placed over the packaged switching devices in the metal enclosure. The printed circuit board is then mechanically fastened to the enclosure and the leads of the packaged switching device are soldered to the printed circuit board. Third, an encapsulant is flowed into the enclosure covering the packaged switching devices and circuit board with leads exposed therefrom for connection to a circuit employing the DC/DC power converter to advantage. Finally, the encapsulant is cured (e.g., through exposure to heat) thereby forming a packaged power supply module.

While the aforementioned technique provides a viable alternative for packaging a power supply, it endures several limitations. First, the metal enclosure is electrically conductive thereby creating an environment where the components of the power supply must be individually isolated therefrom. Second, the thermal and electrical characteristics of the devices therein are unacceptable, namely, the thermal resistance of the power devices is high. In conjunction therewith, the power supply module employed discrete devices and did not incorporate planar magnetic devices into the design. Third, the package density of the power supply module is low. Thus, in a period where the trend is toward higher power density power supply modules, the foregoing design for packaging the power supply module is contrary to the present trend and provides a lower power density package. Finally, the design requires several iterative manual steps that do not support a cost effective and mass producible design for power supply modules.

Accordingly, what is needed in the art is a power supply and a technique for packaging power supply circuitry into a packaged power supply module that enhances the power and device density of the power supply without sacrificing the thermal and electrical characteristics of the devices. Preferably, the technique should be cost-effective and suitable for mass production.

SUMMARY OF THE INVENTION

To address the above-discussed deficiencies of the prior art, the present invention provides a power supply and a method of manufacture therefor. The power supply includes: (1) a circuit board containing conductors for interconnecting electrical components of the power supply, (2) a thermally-conductive case having an integral electrically insulating layer, the thermally-conductive case forming a reservoir to receive the circuit board therein, (3) a power semiconductor device having a body connected in thermal communication with the thermally-conductive case and terminals coupled to the conductors of the circuit board, (4) an encapsulant, located within the reservoir, the encapsulant ensconcing the power semiconductor device and the electrical components and (5) electrical leads extending from the power supply that allow the power supply to be coupled to a printed wiring board.

The present invention therefore introduces a highly compact, thermally-conductive package for a power supply (perhaps a DC/DC converter) that is readily manufacturable, durable and easily mounted to the printed wiring board (allowing the power supply to form a portion of a larger piece of equipment). The encapsulant provides environmental protection (e.g., protection from dirt and moisture) for the power semiconductor device and electrical components of the power supply. The encapsulant may also, among other things, provide a path for heat generated by the electrical components of the power supply and a mechanical fixture to resist displacement of the electrical components therein.

In one embodiment of the present invention, the thermally-conductive case further includes an integral electrically conductive circuit layer; portions of the circuit layer are capable of being removed to form electrically conductive traces therein. The power semiconductor devices or other electrical components may be advantageously located within the thermally-conductive case to enhance a flexibility of the design of the power supply. This is not necessary to the broad scope of the present invention, however.

In one embodiment of the present invention, ones of the conductors are formed as windings and a core is disposed through apertures of the circuit board proximate the windings. The windings and the core form a power magnetic device. The present invention may take advantage of planar magnetics thereby further enhancing the compactness of the power supply. This is not necessary to the broad scope of the present invention, however.

In one embodiment of the present invention, the electrical leads comprise posts extending from the circuit board. In an alternative embodiment of the present invention, portions of an integral electrically conductive circuit layer are capable of being removed to form electrically conductive traces therein; the traces are coupled to a conductor of the circuit board and form the electrical leads. One of the alternatives is set forth in the Detailed Description that follows. However, those skilled in the art will recognize that other structures for communicating electricity to and from the power supply are within the broad scope of the present invention.

In one embodiment of the present invention, the power semiconductor device is soldered to the thermally-conductive case. In an embodiment to be illustrated and described, a power switching device is soldered to the thermally-conductive case. However, the power semiconductor device may be coupled in any manner that is not inconsistent with the objective of allowing the case to serve as a heat sink for the power semiconductor device.

In one embodiment of the present invention, the encapsulant substantially fills the reservoir. Of course, the encapsulant may merely fill a portion of the reservoir.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
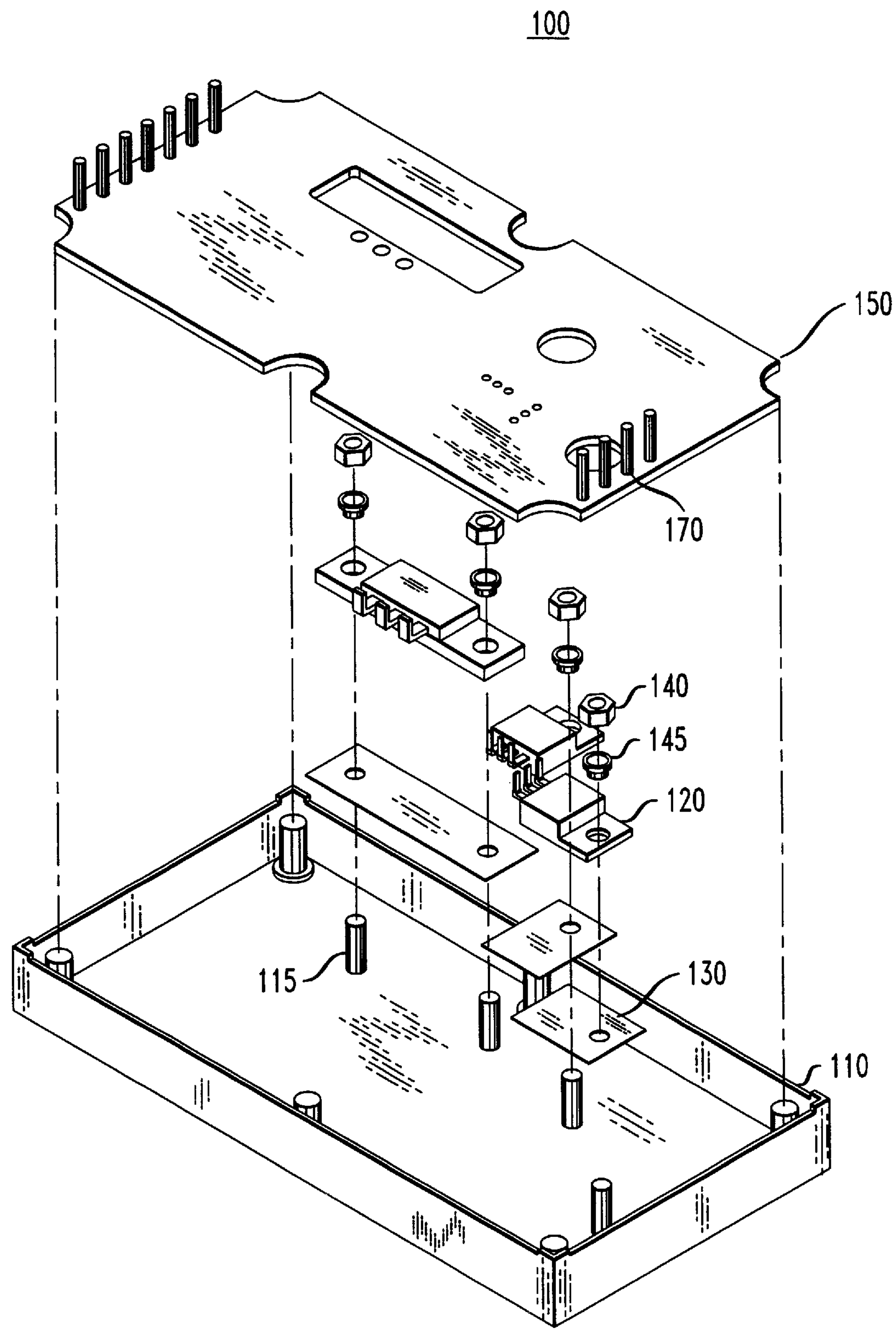
FIG. 1 illustrates an exploded isometric view of a prior art power supply.

Referring initially to FIG. 1, illustrated is an exploded isometric view of a prior art power supply 100. The power supply 100 includes a metal case 110 having a plurality of fasteners (one of which is designated 115). The power supply 100 also includes a plurality of semiconductor power devices (one of which is designated 120) coupled to the metal case 110 (via the fasteners 115) through a plurality of insulators (one of which is designated 130) by a plurality of nuts and washers (one pair of which is designated as 140, 145). The power supply 100 further includes a circuit board 150 having a plurality of electrical components (not shown). The power supply 100 still further includes a plurality of leads (one of which is designated 170) for connection to a printed wiring board of a electrical piece of equipment employing the power supply 100 to advantage.

A method of manufacturing the power supply 100 generally occurs as follows. The insulators 130 are placed in the metal case 110 proximate the fasteners 115. Next, the power semiconductor devices are compression mounted via the washers and nuts 140, 145 in the metal case 110 on the insulators 130. The circuit board 150 including the electrical components is then compression mounted into the metal case 110. The leads of the power semiconductor devices 120 are then soldered to the circuit board 150. Finally, an encapsulant (not shown) is flowed into the metal case 110 and allowed to cure.

For the reasons as previously mentioned, the power supply 100 endures several limitations. First, the metal case 110 is electrically conductive thereby creating an environment where the components of the power supply must be individually isolated therefrom. Second, the package density of the power supply 100 is low. Thus, in a period where the trend is toward higher power density power supply modules, the foregoing design for packaging the power supply 100 is contrary to the present trend and provides a lower power density package. Third, the design requires several iterative manual steps that do not support a cost effective and mass producible design for power supplies 100. Finally, the design employs compression mounting to mount the power semiconductor devices 120 to the metal case 110. Thus, the power semiconductor devices 120 may be subject to variable stresses that may affect the thermal impedance between the power semiconductor devices 120 to the metal case 110; the power semiconductor devices 120 may also be subject to over compression that may cause damage thereto.

Figure 2:
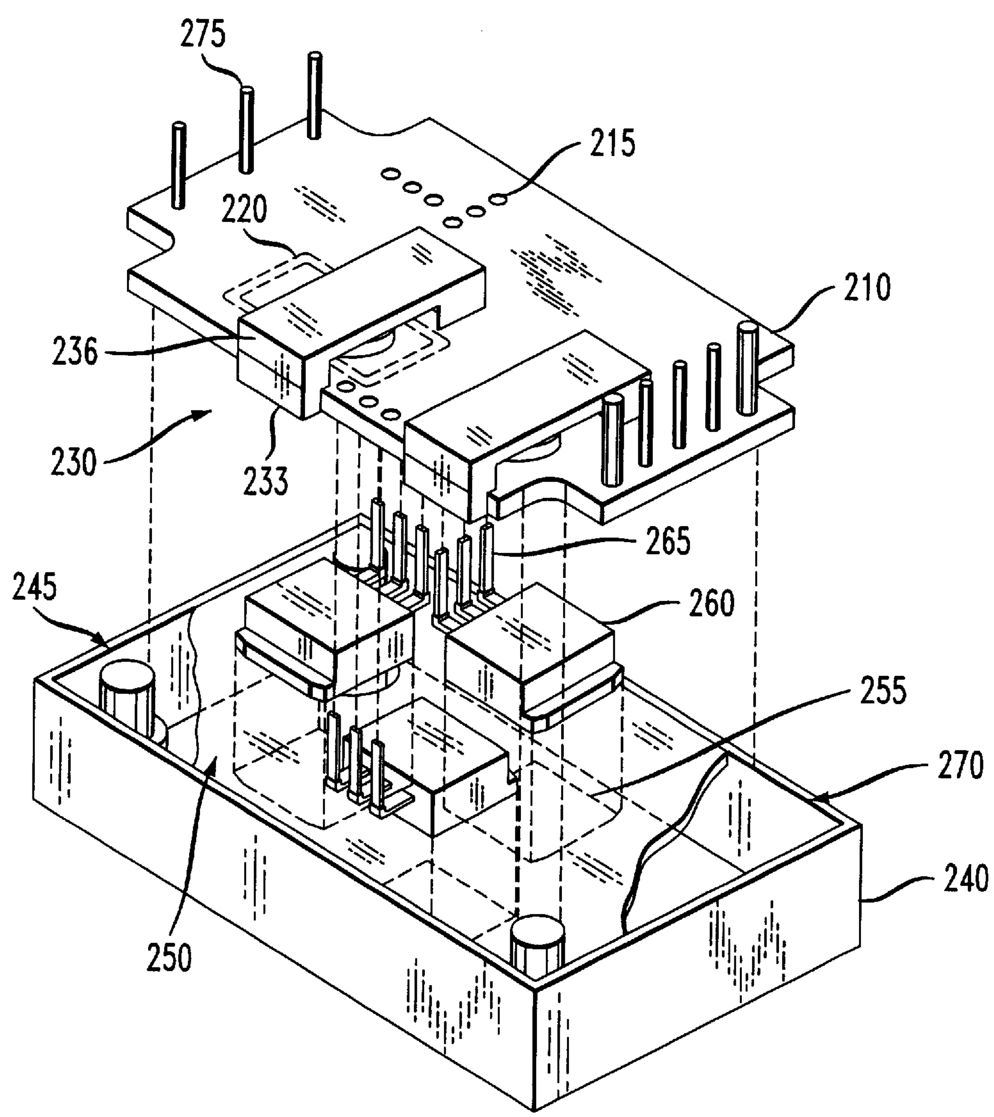
FIG. 2 illustrates an exploded isometric view of an embodiment of a power supply constructed according to the principles of the present invention.

Turning now to FIG. 2, illustrated is an exploded isometric view of an embodiment of a power supply 200 constructed according to the principles of the present invention. The power supply 200 includes a circuit board 210 containing conductors (ones of which are designated 215) for interconnecting electrical components (that may be surface-mounted or through-hole mounted to the circuit board 210) of the power supply 200. Ones of the conductors 215 form windings 220 for a power magnetic device (an electrical component) 230 of the power supply 200. The power magnetic device 230 also includes a power magnetic device core (including a first core half 233 and a second core half 236) disposed through apertures of the circuit board 210 proximate the windings 220. The power supply 200 also includes a metal case 240 having an integral electrically insulating middle layer 245 and an integral electrically conductive inner circuit layer 250. Portions of the inner circuit layer 250 are capable of being removed to form electrically conductive traces (one of which is designated 255) therein. The metal case 240 forms a five-sided reservoir to receive the circuit board 210 therein. In the illustrated embodiment, the metal case 240 is made of an insulative metal substrate such as a THERMAL CLAD substrate manufactured by The Bergquist Company of Minneapolis, Minn. Of course, other substrates or casing materials are well within the broad scope of the present invention.

The power supply 200 also includes a plurality of power semiconductor devices (e.g., a switching device, one of which is designated 260) having a body connected in thermal communication with the metal case 240 and terminals 265 couplable to the conductors 215 of the circuit board 210. The power semiconductor devices 260 are soldered to the metal case 240. The solder joint between the power semiconductor devices 260 and the metal case 240 facilitate a good thermal coupling therebetween. The soldering process also enhances an automatic assembly (e.g., for repeatability purposes) of the power supply 200. Of course, other connection techniques and methods are well within the broad scope of the present invention. The power supply 200 further includes an encapsulant 270, located within the reservoir, for providing a path for heat generated by the electrical components of the power supply 200 and a mechanical fixture to resist displacement of the electrical components. While the encapsulant 270 is illustrated in only a portion of the reservoir, it may substantially fill the reservoir. The power supply 200 still further includes electrical leads (e.g., posts, one of which is designated 275) extending from the power supply 200 that allow the power supply 200 to be coupled to a printed wiring board of an electrical piece of equipment (not shown) employing the power supply 200 to advantage. For instance, the electrical leads 275 may be formed into a gull-wing configuration for surface mounting the power supply 200 to the printed wiring board of the electrical piece of equipment. In an alternative embodiment, ones of the traces 255 may be etched into a periphery of the inner circuit layer 250 to serve as the electrical leads 275 for the power supply 200. For a better understanding of a technique for employing traces of a substrate as leads see *A New Leadframeless IC Carrier Package using Metal Base Substrate*, by Junsuke Tanaka, Kunihiro Nagmin, Tshiharu Koike and Seiichi Takahashi, ISHM Proceedings (1995). The aforementioned reference is herein incorporated by reference.

Figure 3:
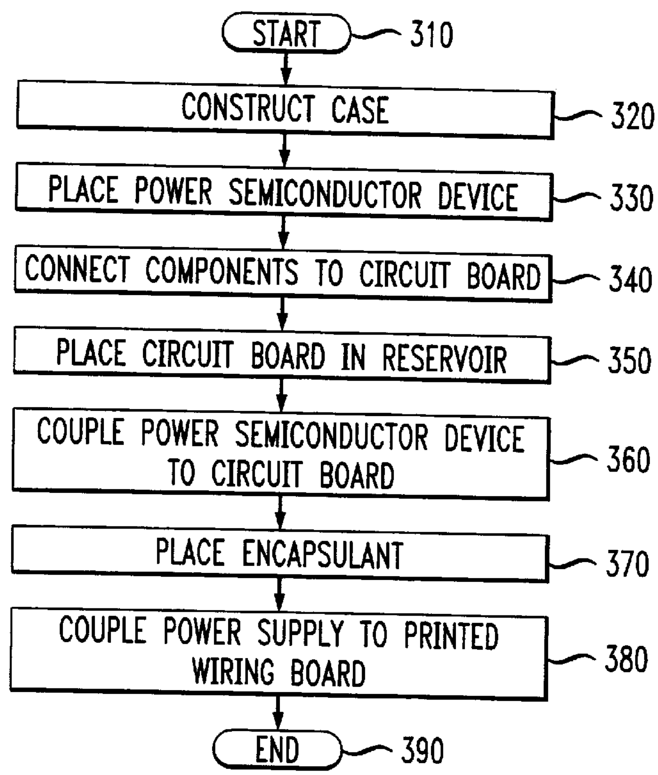
FIG. 3 illustrates a flow diagram of an embodiment of a method of constructing a power supply according to the principles of the present invention.

Turning now to FIG. 3, illustrated is a flow diagram of an embodiment of a method of constructing a power supply according to the principles of the present invention. The method begins at a start step 310, then, a periphery of a substantially planar thermally-conductive material is folded inward to form a five-sided thermally-conductive case having a reservoir therein during a construct case step 320. The peripheral walls may be sealed through several methods such as, without limitation, applying an adhesive, applying an interference-fit plastic insert, welding the corners of the walls, or soldering the interior corners to provide a solderable pattern on an interior layer of the case. Regardless of the selected method, the corners should be meticulously sealed to prevent escape of the encapsulant while placing the encapsulant or during a curing of the encapsulant.

A body of a power semiconductor device is then placed in thermal communication with the thermally-conductive case during a place power semiconductor device step 330. It should be noted that the thermally-conductive material includes an electrically conductive inner circuit layer and portions of the inner circuit layer may be removed to form electrically conductive traces. During the place power semiconductor device step 330, a solder paste is placed proximate a trace or etch pattern in the inner circuit layer; when the power semiconductor device is coupled to the thermally-conductive material, a low thermal impedance connection is created therebetween. Additionally, the terminals of the power semiconductor device may be directly coupled to the trace or bent upwards away from the thermally-conductive case.

The other electrical components (e.g., a power magnetic device) are mounted to a circuit board at a connect components to the circuit board step 340. For instance, a core may be disposed through apertures of the circuit board proximate windings in the circuit board; the windings and the core thereby form a power magnetic device. After the electrical components are coupled to the circuit board, the circuit board is placed within the reservoir of the thermally-conductive case during a place circuit board in reservoir step 350. Assuming that the terminals of the power semiconductor devices are bent upward, the terminals mate with the conductors of the circuit board and are coupled (e.g., soldered) to the conductors to form an electrical connection between the power semiconductor device and the circuit board at a couple power semiconductor device to circuit board step 360. The electrical connection between the thermally-conductive case and circuit board can be made by a solder connection, socket connection or any other method that facilitates low electrical resistance connectivity therebetween. An encapsulant is placed within the reservoir (substantially filling the reservoir) during a place encapsulant step 370. The encapsulant provides environmental protection (e.g., protection from dirt and moisture) for the power semiconductor device and electrical components of the power supply. The power supply is then coupled (via electrical leads or posts extending from the circuit board) to a printed wiring board of an electrical piece of equipment being powered by the power supply at a couple power supply to printed wiring board step 380. The power supply may be coupled to the printed wiring board using any number of techniques including, without limitation, through hole attachment, surface mounting, connector attachment or mechanical piece part attachment (e.g., compression mounting). The method concludes at a end step 390.

Figure 4:
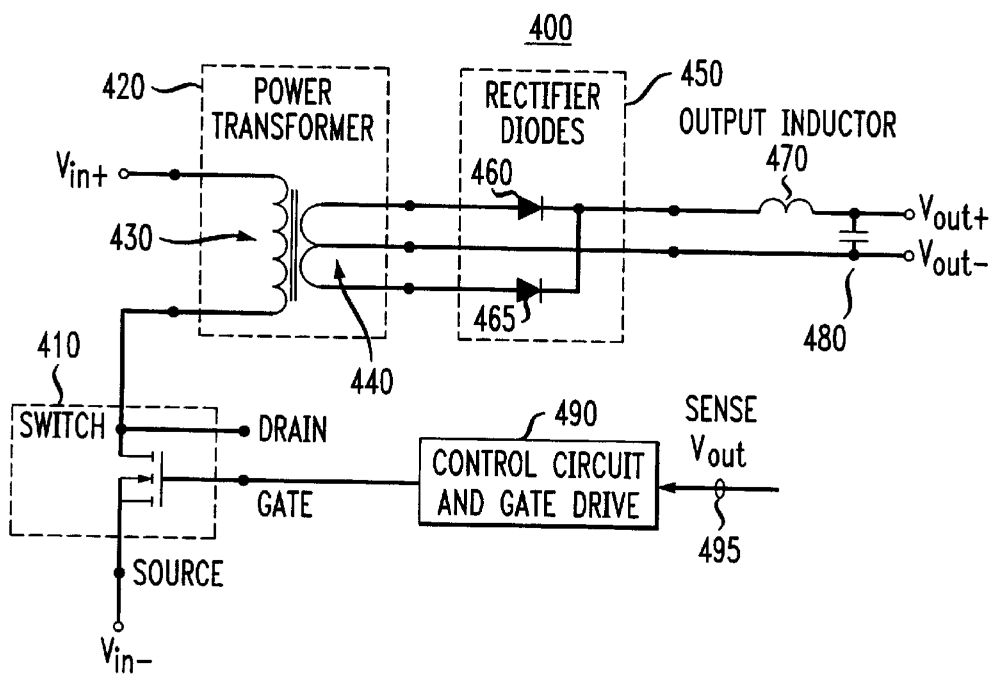
FIG. 4 illustrates a schematic diagram of another embodiment of a power supply constructed according to the principles of the present invention.

Turning now to FIG. 4, illustrated is a schematic diagram of another embodiment of a power supply 400 constructed according to the principles of the present invention. The power supply 400 includes a power switch field effect transistor ("FET") 410 connected to and periodically switched to apply an input voltage $V_{in}$ to a primary winding 430 of a power transformer 420. A secondary winding 440 of the power transformer 420 is connected to a rectifier 450 including a pair of rectifier diodes 460, 465. The rectifier diodes 460, 465 rectify the periodic waveform supplied to the rectifier 450 by the secondary winding 440. A low-pass filter (or output filter circuit) including an inductor 470 and a capacitor 480 act on the rectified waveform to supply a DC output voltage $V_{out}$. A control and drive circuit (or control circuitry) 490 senses the output voltage $V_{out}$ via a lead 495 and produces a pulse train of the proper duty ratio to drive the power switch FET 410.

The power supply 400 is constructed according to the principles of the present invention as described with respect to the preceding FIGUREs. The aforementioned power supplies and method of manufacturing therefor are submitted for illustrative purposes only; of course, other power supply embodiments and alternative methods of manufacturing in accordance with the general principles as submitted herein are well within the broad scope of the present invention.

For a better understanding of power electronic devices (including semiconductor devices) and the associated fabrication processes see *Power Semiconductor Devices*, by B. Jayant Baliga, North Carolina State University (1995). For a better understanding of power electronics including power supplies and conversion technologies see *Principles of Power Electronics*, by J. G. Kassakian, M. F. Schlecht and G. C. Verghese, Addison-Wesley (1991). For a better understanding of construction techniques of power electronic devices and power supplies, see *Electronic Materials Handbook*, Volume I, prepared under the direction of the ASM International Handbook Committee, ASM International (1989). The aforementioned references are herein incorporated by reference.

Although the present invention has been described in detail, those skilled in the art should understand that they can make various changes, substitutions and alterations herein without departing from the spirit and scope of the invention in its broadest form.

What is claimed is:

1. A power supply, comprising:

a circuit board containing conductors interconnecting electrical components of said power supply, one of said conductors forming windings and a core disposed through apertures of said circuit board proximate said windings, said windings and said core forming a power magnetic device;

a thermally-conductive case having an integral electrically insulating layer, said thermally-conductive case forming a reservoir to receive said circuit board therein;

a power semiconductor device having a body connected in thermal communication with said thermally-conductive case and terminals coupled to said conductors of said circuit board;

an encapsulant, located within said reservoir, said encapsulant ensconcing said power semiconductor device, said power magnetic device and said electrical components; and electrical leads extending from said power supply that allow said power supply to be coupled to a printed wiring board.

2. The power supply as recited in claim 1 wherein said thermally-conductive case further comprises an integral electrically conductive circuit layer, portions of said circuit layer capable of being removed to form electrically conductive traces therein.

3. The power supply as recited in claim 1 wherein said electrical leads comprise posts extending from said circuit board.

4. The power supply as recited in claim 1 wherein said power semiconductor device is soldered to said thermally-conductive case.

5. The power supply as recited in claim 1 wherein said encapsulant substantially fills said reservoir.

6. The power supply as recited in claim 1 wherein said thermally-conductive case further comprises an integral electrically conductive circuit layer, portions of said circuit layer capable of being removed to form electrically conductive traces therein, said traces coupled to a conductor of said circuit board and forming said electrical leads.

7. A power supply, comprising:

a circuit board containing conductors interconnecting electrical components of said power supply, one of said conductors forming windings and a core disposed through apertures of said circuit board proximate said windings, said windings and said core forming a power magnetic device;

a metal case having an integral electrically insulating middle layer and an integral electrically conductive inner circuit layer, portions of said inner circuit layer capable of being removed to form electrically conductive aces therein, said metal case forming a five-sided reservoir to receive said circuit board therein;

a power semiconductor device having a body connected in thermal communication with said metal case and terminals coupled to said conductors of said circuit board;

an encapsulant, located within said reservoir, said encapsulant ensconcing said power semiconductor device, said power magnetic device and said electrical components; and electrical leads extending from said power supply that allow said power supply to be coupled to a printed wiring board.

8. The power supply as recited in claim 7 wherein said traces are coupled to a conductor of said circuit board and form said electrical leads.

9. The power supply as recited in claim 7 wherein said electrical leads comprise posts extending from said circuit board.

10. The power supply as recited in claim 7 wherein said power semiconductor device is a power switch.

11. The power supply as recited in claim 7 wherein said encapsulant substantially fills said reservoir.

12. The power supply as recited in claim 7 wherein said electrical components comprise a transformer, output filter circuit and control circuitry.

13. A method of manufacturing a power supply, comprising the steps of:

providing a circuit board containing conductors interconnecting electrical components of sad power supply, one of said conductors forming windings;

mounting ones of said electrical components to said circuit board;

placing a body of a power semiconductor device in thermal communication with a thermally-conductive case, said thermally-conductive case having an integral electrically insulating layer;

disposing a core through apertures of said circuit board proximate said windings, said windings and said core forming a power magnetic device;

placing said circuit board within a reservoir of said thermally-conductive case;

coupling terminals of said power semiconductor device to said conductors of said circuit board; and placing an encapsulant within said reservoir, said encapsulant ensconcing said power semiconductor device, said power magnetic vice and said electrical components, electrical leads extending from said power supply to allow said power supply to be coupled to a printed wiring board.

14. The method as recited in claim 13 wherein said thermally-conductive case further comprises an integral electrically conductive circuit layer, the step of providing further comprising the step of removing a portion of said circuit layer to form electrically conductive traces therein.

15. The method as recited in claim 13 further comprising the step of mounting posts to said circuit board to form said electrical leads.

16. The method as recited in claim 13 wherein said step of placing said body comprises the step of soldering said power semiconductor device to said thermally-conductive case.

17. The method as recited in claim 13 wherein said step of placing said encapsulant comprises the step of substantially filling said reservoir with said encapsulant.

18. The method as recited in claim 13 further comprising the step of forming said thermally-conductive case from a substantially planar thermally-conductive material, a periphery of said planar thermally-conductive material being folded inward to form said reservoir of said thermally-conductive case.

* * * * *